United States Patent
Amano et al.

(10) Patent No.: US 11,210,764 B2
(45) Date of Patent: Dec. 28, 2021

(54) APPARATUS FOR PERFORMING WORK ON SUBSTRATE

(71) Applicant: FUJI CORPORATION, Chiryu (JP)

(72) Inventors: Masafumi Amano, Okazaki (JP); Hiroshi Oike, Chiryu (JP); Kazuya Kotani, Toyota (JP)

(73) Assignee: FUJI CORPORATION, Chiryu (JP)

( * ) Notice: Subject to any disclaimer, the term of this patent is extended or adjusted under 35 U.S.C. 154(b) by 96 days.

(21) Appl. No.: 16/614,840

(22) PCT Filed: Jun. 21, 2017

(86) PCT No.: PCT/JP2017/022841
§ 371 (c)(1),
(2) Date: Nov. 19, 2019

(87) PCT Pub. No.: WO2018/235186
PCT Pub. Date: Dec. 27, 2018

(65) Prior Publication Data
US 2020/0202492 A1    Jun. 25, 2020

(51) Int. Cl.
*G06K 9/32*      (2006.01)
*G06T 3/40*      (2006.01)
(Continued)

(52) U.S. Cl.
CPC .......... *G06T 3/4053* (2013.01); *G06K 9/3216* (2013.01); *H04N 5/232133* (2018.08);
(Continued)

(58) Field of Classification Search
CPC .. G06T 3/4053; H05K 13/0812; H05K 13/04; H04N 5/232133; G06K 9/3216; G06K 2009/3225
See application file for complete search history.

(56) References Cited

U.S. PATENT DOCUMENTS

| 8,878,950 B2 * | 11/2014 | Lelescu ............. H04N 5/23232 348/218.1 |
| 2014/0375865 A1 * | 12/2014 | Shroff .................. G06T 3/4053 348/333.12 |

(Continued)

FOREIGN PATENT DOCUMENTS

| EP | 3 118 572 A1 | 1/2017 |
| JP | 02-213983 A | 8/1990 |

(Continued)

OTHER PUBLICATIONS

International Search Report dated Sep. 26, 2017 in PCT/JP2017/022841 filed on Jun. 21, 2017.

*Primary Examiner* — Siamak Harandi
(74) *Attorney, Agent, or Firm* — Oblon, McClelland, Maier & Neustadt, L.L.P.

(57) ABSTRACT

An apparatus for performing work on a substrate includes an image processing device acquiring multiple images captured at different positions by performing imaging multiple times after a camera has been moved by a moving device such that a reference mark of a circuit board is within a range inside a field of view of the camera, creating a super resolution image using multi-frame super resolution processing, and recognizing the reference mark. The image processing device performs candidate region search processing of processing the image captured initially to search for a region within the image including a portion that has a possibility of being the reference mark as a candidate region after completion of the initial imaging, performs multi-frame super resolution processing on the candidate region after completion of final image capturing, creates a super resolution image of the candidate region, and recognizes the reference mark.

8 Claims, 5 Drawing Sheets

(51) Int. Cl.
*H05K 13/08* (2006.01)
*H04N 5/232* (2006.01)
*H05K 13/04* (2006.01)

(52) U.S. Cl.
CPC . *H05K 13/0812* (2018.08); *G06K 2009/3225* (2013.01); *H05K 13/04* (2013.01)

(56) References Cited

U.S. PATENT DOCUMENTS

2015/0173260 A1\* 6/2015 Gieskes .................. B25J 19/02
    29/832
2016/0249497 A1\* 8/2016 Ito ...................... H05K 13/0413

FOREIGN PATENT DOCUMENTS

| JP | 05-187840 A | 7/1993 | |
|---|---|---|---|
| JP | 8-111599 A | 4/1996 | |
| JP | 2009-273005 A | 11/2009 | |
| JP | 4715009 B2 \* | 7/2011 | ............... G06T 1/00 |
| JP | WO2015/049723 A1 | 4/2015 | |
| JP | 2017-5217 A | 1/2017 | |
| JP | WO2017/098561 A1 | 6/2017 | |

\* cited by examiner

APPARATUS FOR PERFORMING WORK ON SUBSTRATE

TECHNICAL FIELD

The present specification discloses technology relating to an apparatus for performing work on a substrate provided with an image processing device for performing image recognition of a recognition target such as a reference mark of a circuit board loaded by a conveyor.

BACKGROUND ART

For example, in a component mounter, a component insertion machine, a screen printer, a visual inspection machine, or the like installed in a component mounting line for manufacturing a component-mounted board, as disclosed in patent literature 1 (JP-A-2017-5217) or the like, in order to detect the position of a circuit board loaded by a conveyor, a reference mark of the circuit board loaded by the conveyor is imaged by a camera from above, the image is processed to recognize the position of the reference mark, and the position of the circuit board is detected with reference to the position of the reference mark.

CITATION LIST

Patent Literature

Patent Literature 1: JP-A-2017-5217
Patent literature 1: WO2015-049723

SUMMARY OF INVENTION

Technical Problem

In recent years, as component mounting densities on circuit board have increased and mounted components have miniaturized, reference marks of circuit boards have tended to be miniaturized. For example, a circuit board may be provided with reference marks having a size of 50 micrometers to 500 micrometers. For this reason, as described in the above-mentioned patent literature 1, with normal image processing for processing a low-resolution image acquired by a single imaging, it is sometimes difficult to accurately recognize a tiny reference mark, and as a result, there is a possibility that the accuracy of detecting the position of the reference mark deteriorates, or that the position of the reference mark is erroneously detected by erroneously recognizing an item other than the reference mark reflected in the captured image as the reference mark.

In order to solve such problems, the present inventors have researched and developed a technique for recognizing a circuit board reference mark using multi frame super resolution processing by applying the multi frame super resolution processing technique described in patent literature 2 (WO2015/049723) to perform image recognition of a circuit board reference mark, and in the course of the research and development, the following new problem has been discovered.

That is, when multi frame super resolution processing is performed, the camera is moved within a range such that the the circuit board reference marks fit in the field of view of the camera, and imaging is performed multiple times, whereby multiple low-resolution images are acquired at different positions, and a super resolution image is created by the multi frame super resolution processing so as to recognize the reference mark. However, since the multi frame super resolution processing has a larger calculation quantity than the normal image processing, the image processing time becomes longer, which increases the cycle time, causing productivity to decrease. Note that, even single frame super resolution processing in which a high resolution image is estimated from one low resolution image causes the image processing time to be lengthened in a similar manner.

As a countermeasure to this, one may consider not performing super resolution processing on the entire region of the low-resolution image, but, as in patent literature 2, limiting the region for which super resolution processing is performed to a portion of the low resolution image. In patent literature 2, in order to perform image recognition of a component picked up and held by a suction nozzle of a component mounter, among a low resolution image captured such that components are within the field of view of the camera, an imaging target for super resolution processing is limited to a region including components, and by performing super resolution processing on only this target region, the calculation quantity of the super resolution processing is reduced, so as to shorten image processing time.

As in patent literature 2, in a case in which a component held by a suction nozzle is the recognition target, since the component held by the suction nozzle is moved to an imaging position above a camera that is fixed facing upwards, the error in the position of the component (recognition target) within the low resolution image captured by the camera can be kept within small dimensions of an amount dependent on the component pickup deviation based on the position control of the suction nozzle. Therefore, it is relatively easy to accurately define the target region of the super resolution processing from the position of the suction nozzle.

However, when the recognition target is a reference mark of the circuit board loaded by a conveyor, since the conveyance accuracy of the conveyor is poor, the variation in the position of the reference mark shown in the low resolution image captured by the camera is large, and, furthermore, a pattern or the like having a shape similar to the reference mark may be formed near the reference mark of the circuit board (within the field of view of the camera), such that it may be difficult to distinguish the pattern or the like having a shape similar to the reference mark shown in the low resolution image from the reference mark. Therefore, when the recognition target is a reference mark of the circuit board, it is difficult to correctly limit the target region of the super resolution processing in the low resolution image captured by the camera, and this is a factor that makes it difficult to apply the super resolution processing of patent literature 2 to image recognition of a circuit board reference mark.

Note that, in addition to reference marks, circuit board recognition targets include codes, characters, symbols, marks, and the like, such as one-dimensional codes, two-dimensional codes, and the like, which represent board information, and these recognition targets also tend to be miniaturized in the same manner as reference marks, thereby causing the same problems as for image recognition of reference marks.

Solution to Problem

To solve the above problems, disclosed herein is an apparatus for performing work on a substrate including: a conveyor configured to load a circuit board to a work position; a camera configured to image a region including a recognition target of the circuit board loaded to the work position; a moving device configured to move the camera relatively to the circuit board loaded to the work position; and an image processing device configured to acquire an image captured after the circuit board and camera have been relatively moved by the moving device such that the recognition target of the circuit board is within a range inside a field of view of the camera, create a super resolution image using super resolution processing, and recognize the recognition targets, wherein the image processing device is further configured to perform candidate region search processing of processing the captured image to search within the image for at least one region including a portion that might be the recognition target as a candidate region, perform the super resolution processing on the candidate region searched in the candidate region search processing, and create a super resolution image of the candidate region so as to recognize the recognition target. Here, the apparatus may be configured to, when multiple candidate regions exist, create a super resolution image for each of the candidate regions, and identify whether a portion of the super resolution image that has a possibility of being the recognition target is the recognition target based on a recognition result of the super resolution image.

With this configuration, since candidate region search processing of processing the captured image to search within the image for at least one region including a portion that might be the recognition target as a candidate region is performed, even if the position of the recognition target in the image captured by the camera is shifted greatly due to poor conveyance accuracy of the conveyor, the region including a portion that might be the recognition target in the image can be limited as a candidate region by the candidate region search processing. Further, when a pattern or the like having a shape similar to the recognition target appears in the image captured by the camera, and it is difficult to distinguish and recognize the pattern or the like having a shape similar to the recognition target from the recognition target, multiple regions in the image including a portion that might be the recognition target can be limited as multiple candidate regions by the candidate region search processing, and the recognition target can be included in one of the multiple candidate regions. The image processing device may perform multi frame super resolution processing or single frame super resolution processing as the super resolution processing. The moving device may be configured to move the camera relative to a circuit board positioned and stationary at the work position, or may be configured to move the circuit board loaded to the work position relative to a fixed camera, or may be configured to move both the circuit board and the camera.

The image processing device may be configured to acquire multiple images captured at different positions by using the moving device to relatively move the camera and the circuit board to capture multiple images within a range in which the recognition target of the circuit board falls within the field of view of the camera, and create a super resolution image by multi frame super resolution processing. Further, the image processing device may be configured to perform candidate region search processing for processing an image initially captured and searching the captured image for at least one region including a portion that has a possibility of being the recognition target as a candidate region after completion of the initial image capturing, parallel with an operation of relatively moving the camera and the circuit board to a subsequent imaging position, and perform multi frame super resolution processing on the candidate region searched in the candidate region search processing using the multiple images after completion of final image capturing.

With this configuration, since the candidate region searching processing is performed in parallel with the operation of moving the camera to the next imaging position after the initial imaging is completed, unlike when the candidate region searching processing is performed after the final imaging is completed, it is possible to avoid delaying the starting of the multi frame super resolution processing by the candidate region searching processing after the final imaging is completed.

Further, since the multi frame super resolution processing is performed only in the candidate region searched by the candidate region search processing using multiple images after the final imaging is completed, the multi frame super resolution processing can be shortened as compared with a case where the multi frame super resolution processing is performed on all the regions of the captured image. Moreover, since the super resolution image of the candidate region searched in the candidate region search processing is created to recognize the recognition target, the recognition target can be recognized with high accuracy using the super resolution image of the candidate region, and when the region including the pattern or the like of a shape similar to the recognition target is searched as the candidate region, the pattern or the like of the shape similar to the recognition target can be recognized by distinguishing the recognition target from the pattern or the like using the super resolution image of the candidate region, making it possible to prevent the pattern or the like of the shape similar to the recognition target from being erroneously recognized as the recognition target.

Note that, although it may be thought that there are many cases in which the candidate region search processing will be completed before the final imaging is completed, in a case in which the candidate region search processing has not completed at the point at which the final image capturing has been completed, the candidate region search processing may be completed and then the multi frame super resolution processing may be performed on the candidate region.

Alternatively, in a case in which the candidate region search processing has not completed at the point at which the final image capturing has been completed, at a point at which a specified quantity of candidate regions have been searched or after a specified time has elapsed, the candidate region search processing may be completed and then the multi frame super resolution processing may be performed on the candidate region.

DESCRIPTION OF EMBODIMENTS

The following describes an embodiment of a component mounter as an example of an apparatus for performing work on a substrate.

Figure 1:
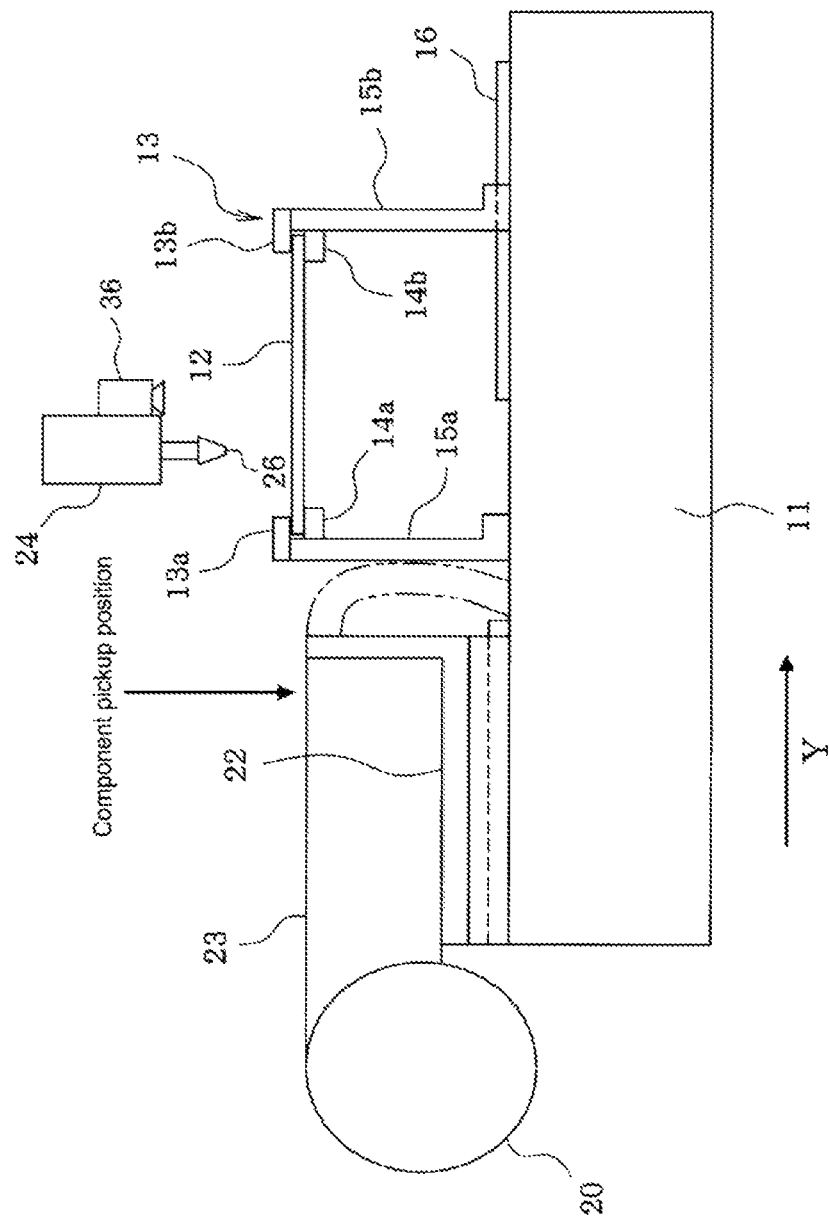
FIG. 1 is a side view showing a configuration of a main section of a component mounter of an embodiment.

First, the configuration of the component mounter will be described based on FIG. 1. Conveyor 13 that conveys circuit board 12 is provided on base 11 of the component mounter (below, the conveyance direction of circuit board 12 by conveyor 13 is referred to as the X direction, and the direction perpendicular to that is referred to as the Y direction). Of support members 15a and 15b that support the two conveyor rails 13a and 13b and conveyor belts 14a and 14b that configure conveyor 13, support member 15a is fixed at a specified position, with the support member 15b on the opposite side being adjusted in the Y direction along guide rail 16 by a screw mechanism (not shown) or the like such that the width of conveyor 13 (the gap between conveyor rails 13a and 13b) is adjustable to the width of circuit board 12.

Also, feeder setting table 22 is provided to the side of conveyor 13 on base 11, with multiple feeders 23 being removably set on feeder setting table 22 in the Y direction. Set on each feeder 23 is a reel 20 on which is wound component supply tape housing many components at a fixed pitch, with the reel 20 being set such that the leading component of the component supply tape pulled from the reel 20 is positioned at a component pickup position (position at which the component is picked up by suction nozzle 26).

The component mounter is provided with head moving device 25 (see FIG. 2) for moving mounting head 24 horizontally (in the XY direction) and vertically (in the Z direction). One or multiple suction nozzles 26 for picking up a component fed to the component pickup position by feeder 23 are held pointing downwards on mounting head 24. Also, the component mounter is provided with mark imaging camera 36 that is moved together with mounting head 24 by head moving device 25 (moving device) and that images from above reference marks of circuit board 12, and component imaging camera 35 (refer to FIG. 2) that images from below a component held by suction nozzle 26.

Figure 2:
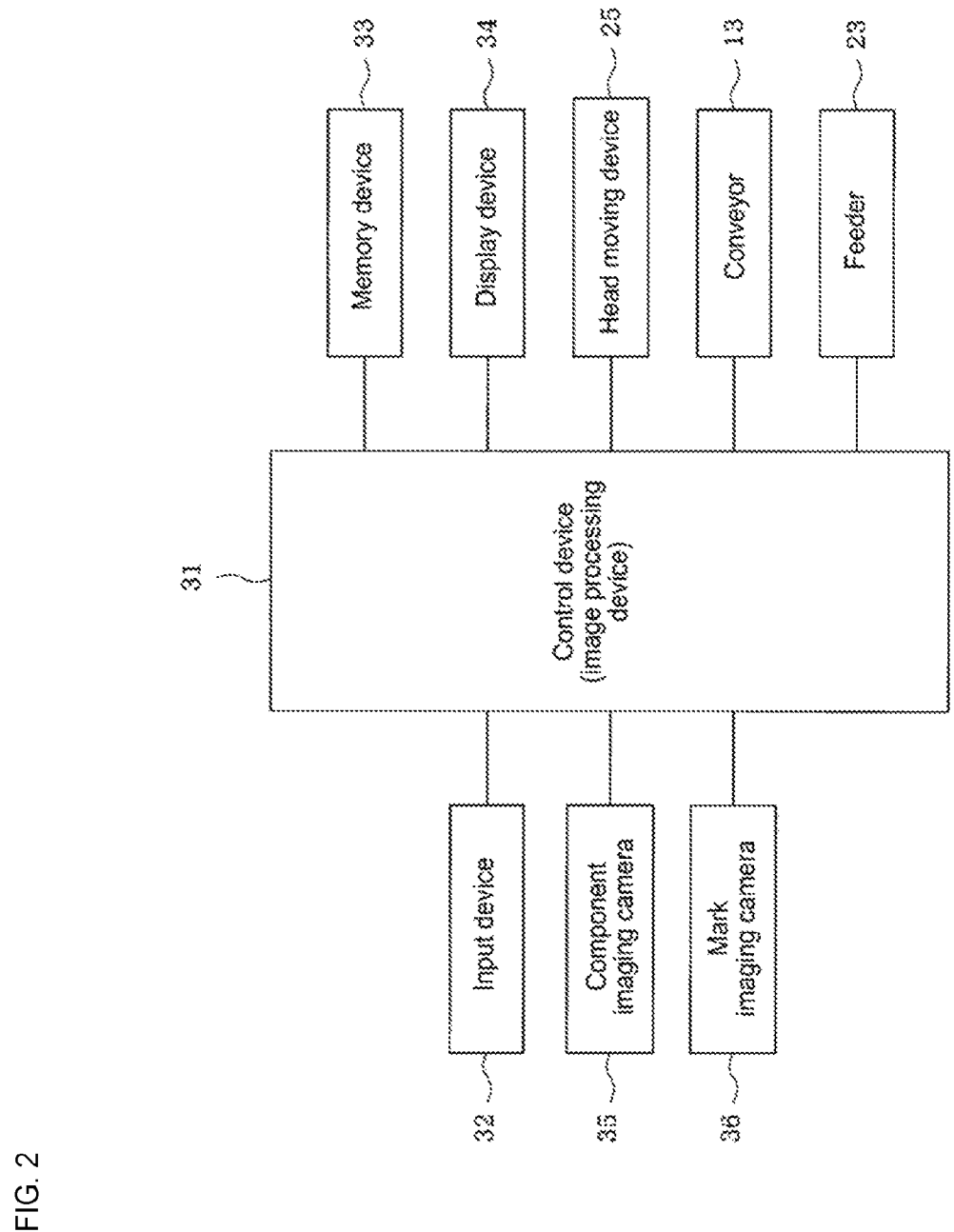
FIG. 2 is a block diagram showing the configuration of a control system of the component mounter.

As shown in FIG. 2, connected to control device 31 of the component mounter are input device 32 such as a keyboard, mouse, or touch panel, memory device 33 such as a hard disk, RAM, or ROM that memorizes the reference mark image recognition operation control program of FIG. 3 that is described later, and display device 34 such as an LCD display or CRT.

Control device 31 of the component mounter is configured mainly from one or multiple computers (one or multiple CPUs) and controls operation of each function of conveyor 13 and functions as an image processing section that processes images captured by mark imaging camera 36 and component imaging camera 35 to recognize various recognition targets. Specifically, control device 31 of the component mounter uses mark imaging camera 36 to perform imaging multiple times from above of a reference mark, which is a recognition target, of circuit board 12 conveyed to a specified work position by conveyor 13, recognizes the reference mark by multi frame super resolution processing to be described later, measures the respective component mounting positions of the circuit board 12 with reference to the position of the reference mark, then moves mounting head 24 in order to the following positions: component pickup position→component imaging position→component mounting position, during which a component supplied from feeder 23 is picked up by suction nozzle 26 of mounting head 24, the electronic component is imaged by component imaging camera 35, the captured image is processed to measure the pickup position (X, Y) and the angle θ of the component, the deviation of the pickup position (X, Y) and the angle θ of the component are corrected, and the component is mounted on the circuit board 12.

Further, control device 31 of the component mounter also functions as an image processing device for performing the multi frame super resolution processing, and by performing the reference mark image recognition operation control program of FIG. 3, which is described later, moves mark imaging camera 36 such that the reference mark of circuit board 12 fits within the field of view of camera 36, performs imaging multiple times, acquires multiple low resolution images captured at different positions, and creates a super resolution image by performing the multi frame super resolution processing, so as to recognize the reference mark. Here, in order to shorten the duration of the multi frame super resolution processing, control device 31 performs candidate region search processing for processing a low resolution image initially captured and searching the captured image for at least one region including a portion that has a possibility of being the recognition target as a candidate region after completion of the initial image capturing, parallel with an operation of relatively moving mark imaging camera 36 to the subsequent imaging position, performs multi frame super resolution processing on the candidate region searched in the candidate region search processing using the multiple low resolution images after completion of final image capturing, creates a super resolution image of the candidate region, recognizes the reference mark, and measures the position (X, Y) of the reference mark.

Here, "a portion that has a possibility of being a reference mark" includes a portion that is difficult to distinguish from a reference mark (that is, a portion that may be erroneously recognized as the reference mark) and a reference mark, as determined from just the processing result of the low resolution image captured initially. The size of the candidate region may be any size that includes the entire portion that has a possibility of being a reference mark. Generally, the smaller the size (area) of the candidate region, the shorter the duration of the multi frame super resolution processing, therefore a smaller sized candidate region is more desirable. The size of the candidate region may be a predetermined constant value, or the size of the candidate region may be automatically set in accordance with the size of the portions that have a possibility of being a reference mark recognized by control device 31 in the candidate region search processing. Alternatively, an operator may manually operate input device 32 to set the size of the candidate region.

Figure 4:
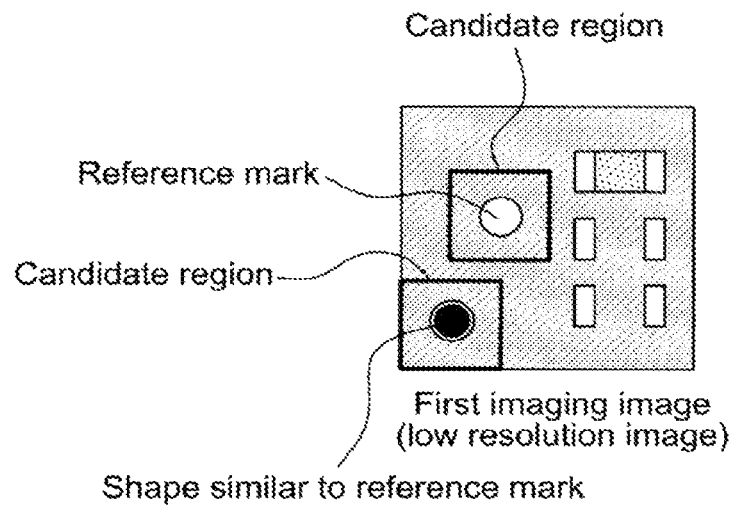
FIG. 4 illustrates an example in which a candidate region including a portion that may be a reference mark in a low resolution image initially captured by the mark imaging camera is searched.
Figure 5:
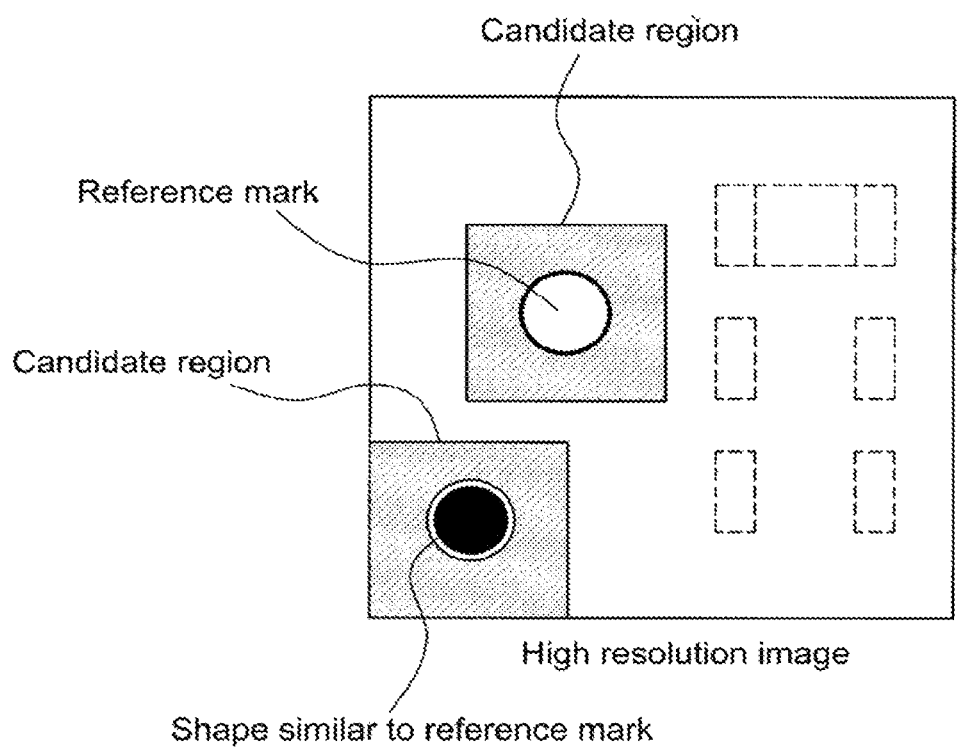
FIG. 5 illustrates an example in which multi frame super resolution processing is performed on a candidate region to create a super resolution image of the candidate region.

As shown in FIG. 4, when there are multiple candidate regions searched by the candidate region search processing, as shown in FIG. 5, a super resolution image is created for each candidate region, and it is identified whether a portion that has a possibility of being a reference mark that appears in the super resolution image is a reference mark.

In this case, the criteria in the candidate region search processing for determining whether a candidate region is to be defined (that is, whether there is a possibility of a reference mark) may be constant or may be changeable.

Generally, if the determination criteria is stricter, the number of candidate regions found in the candidate region search processing is reduced, and accordingly, this has the benefit of shortening the time required for the multi frame super resolution processing, however, depending on the design of circuit board 12 around the reference mark and the size, shape, material, and brightness value of the reference mark, there is a possibility that it becomes difficult to find a portion for which there is a possibility of being a reference mark from the initially captured low resolution image, meaning that the search for a candidate region including a reference mark fails.

On the other hand, if the determination criteria is too loose, there is an advantage that it becomes easier to find a portion for which there is a possibility of being a reference mark from the initially captured low resolution image, meaning that it is possible to more reliably find a candidate region including a reference mark, however, against this, the number of candidate regions found by the candidate region search processing increases, and the duration of the multi frame super resolution processing may become longer accordingly.

Therefore, the determination criteria may be changed based on the design of circuit board 12 around the reference mark or at least one of the size, shape, material, and brightness value of the reference mark, considering that the difficulty of discovering a portion for which there is a possibility of being a reference mark from the low resolution image captured initially varies depending on the design of circuit board 12 around the reference mark and the size, shape, material, and brightness value of the reference mark. The criteria may be changed automatically by control device 31 or by an operator manually operating input device 32.

Further, when no candidate region is found in a single candidate region search processing, the determination criteria may be relaxed and the candidate region search processing may be performed again. Accordingly, when a reference mark appears in an initially captured low resolution image, even if the search for a candidate region including the reference mark fails in the first candidate region search processing, the search for a candidate region including the reference mark may be successful in second and subsequent candidate region search processing. If no candidate region can be found even if the candidate region search processing is repeated a predetermined number of times, it may be determined that a reference mark does not appear in the initially captured low resolution image, and the component mounter may be stopped with an error, with the operator being warned via a display or sound. In this case, control device 31 may automatically start over from initial imaging, in which case, the imaging position of mark imaging camera 36 may be corrected such that the reference mark falls within the field of view of the camera 36.

Figure 6:
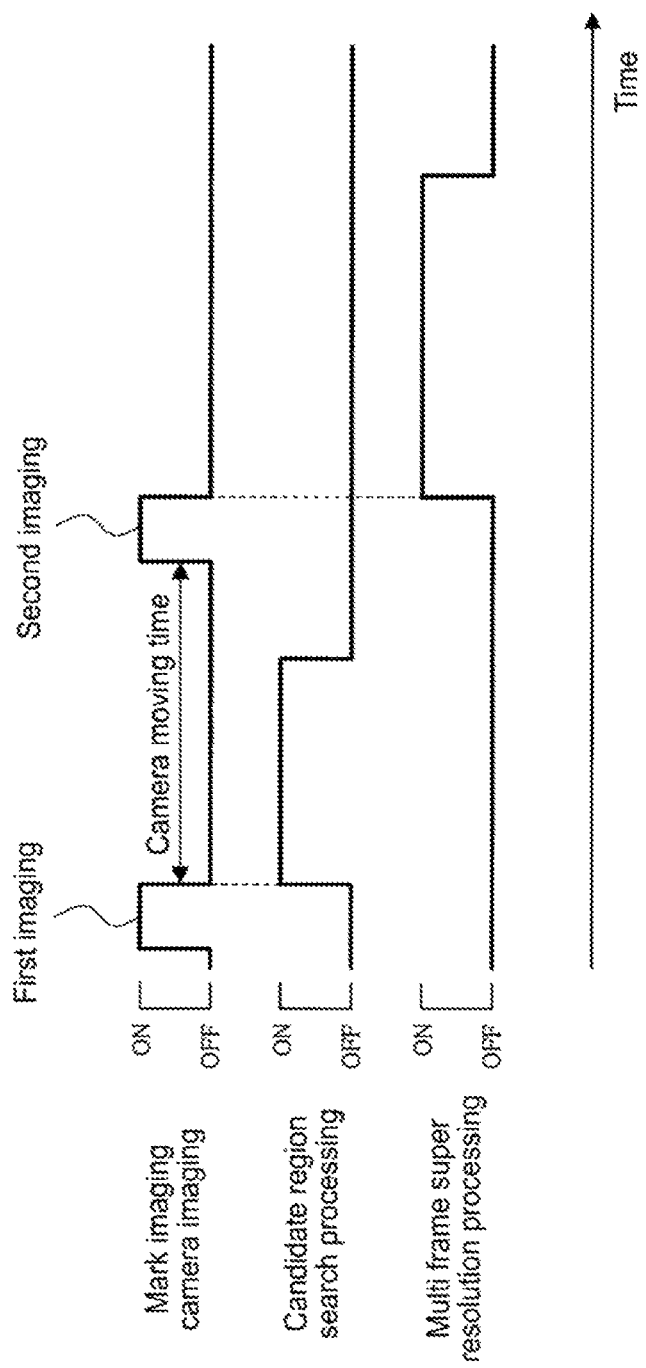
FIG. 6 is a timing chart for illustrating the timing of performing imaging using the mark imaging camera, candidate region search processing, and multi frame super resolution processing during the reference mark image recognizing operation.

In addition, as shown in FIG. 6, it may be considered that the candidate region searching processing will often be completed before the final imaging is completed (in the example of FIG. 6, at the second time), but depending on the design of circuit board 12 around the reference mark, and the size, shape, material, and brightness value of the reference mark, there is a possibility that the time for candidate region search processing is extended and that the candidate region search processing is not completed at the point when the final imaging is completed. Therefore, when the candidate region search processing is not finished at the point when the final imaging is completed, the multi frame super resolution processing may be performed on the candidate region after the candidate region search processing is completed.

Alternatively, in a case in which the candidate region search processing is not finished at the point when the final imaging is completed, it may be determined that the candidate region including the reference mark has been found at the point when a predetermined number of candidate regions has been searched or at a point when a predetermined time has elapsed, then the candidate region search processing may be completed and the multi frame super resolution processing performed on the candidate region.

Note that, even when three or more low resolution images are acquired by capturing the reference mark three or more times using mark imaging camera 36, the candidate region search processing may be performed only on the first (initial) low resolution image. In this case, the second and subsequent low resolution images are used together with the first low resolution image when performing the multi frame super resolution processing.

Control device 31 displays the super resolution images of the respective candidate regions created by the multi frame super resolution processing on display device 34, and displays an enlarged low resolution image (for example, a bicubic enlarged image) at the same resolution as the super resolution image in a region other than the candidate region or a background of a specified brightness value (for example, 0 or 255 in a case of a camera with 256-level grayscale). As a result, the operator can visually confirm the super resolution images of the respective candidate regions displayed on display device 34, and can visually confirm that a reference mark is included in any of the candidate regions and that the reference mark is correctly recognized.

Figure 3:
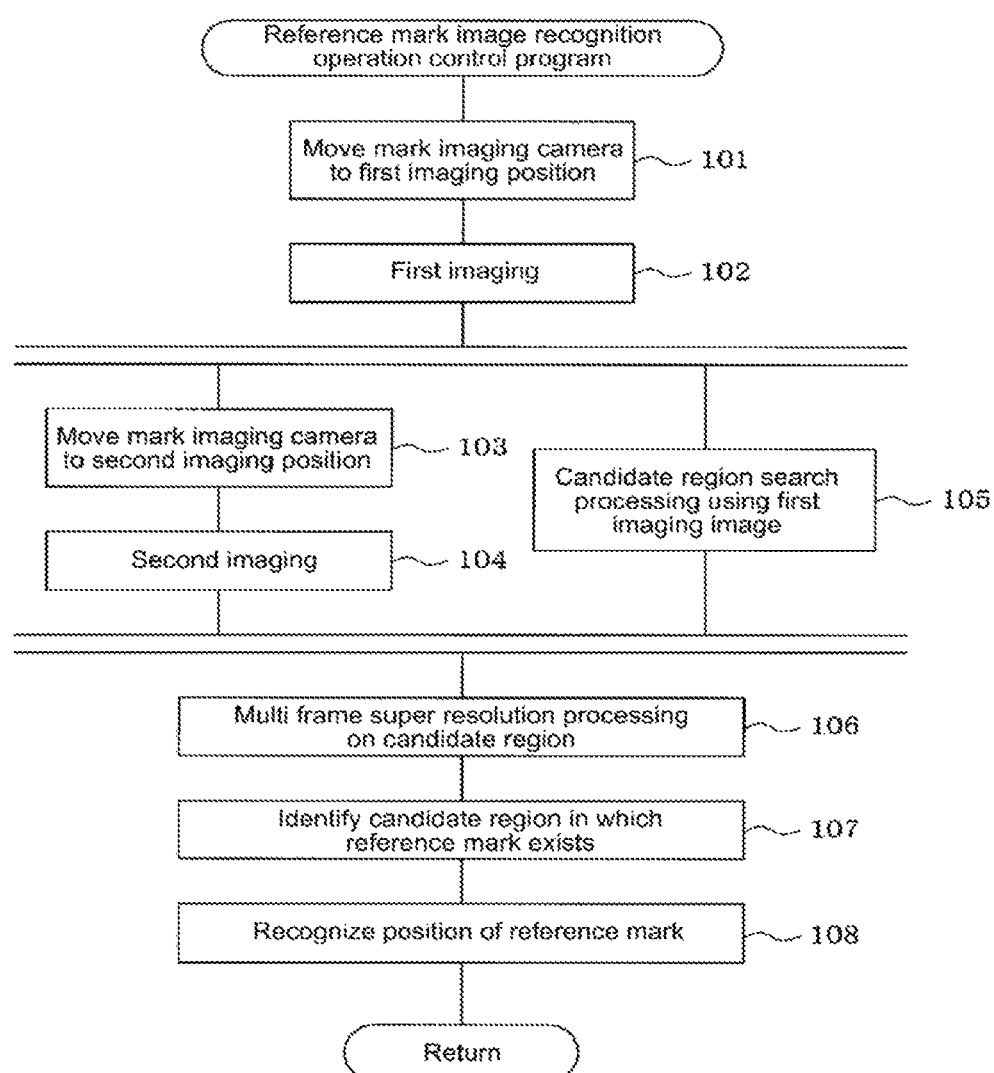
FIG. 3 is a flow chart showing the flow of processing of the reference mark image recognition operation control program.

Image recognition of reference marks of the present embodiment described above is performed by control device 31 in accordance with the reference mark image recognition operation control program of FIG. 3. The reference mark image recognition operation control program of FIG. 3 is an example of when imaging of reference marks is performed by mark imaging camera 36 twice. Therefore, "first imaging" is "initial image capturing" and "second imaging" is "final image capturing".

The reference mark image recognition operation control program shown in FIG. 3 is performed by control device 31 each time a circuit board 12 is loaded to a specified operation position by conveyor 13 while the component mounter is operating (during production). When the program is started, first, in step 101, mark imaging camera 36 is moved by head moving device 25 to the first imaging position located above a reference mark of circuit board 12, such that the reference mark of circuit board 12 is within the field of view of camera 36. Then, proceeding to step 102, first imaging is performed by mark imaging camera 36, and a low resolution image obtained by imaging an area including the reference mark and the surrounding area is acquired.

Then, steps 103 to 104 of moving mark imaging camera 36 and performing second imaging, and step 105 of candidate region search processing are performed in parallel.

Specifically, after the first imaging is completed, processing of steps 103 to 104 is performed, and head moving device 25 moves mark imaging camera 36 to the second imaging position at which the reference mark falls within the field of view of the camera 36, and the second imaging is performed. Here, the second imaging position may be set to a position separated from the first imaging position by, for example, 0.5 pixels in the X direction and 0.5 pixels in the Y direction.

Parallel to the moving of mark imaging camera 36 and the second imaging, the candidate region search processing of step 105 is performed immediately after completion of the first imaging. In the candidate region search processing, the low resolution image acquired in the first imaging is processed, and a region including a portion in the image that has a possibility of being a reference mark is searched as a candidate region based on the processing result. Thus, one or multiple candidate regions are set in the low resolution image.

As described above, after completing the second imaging and candidate region search processing, processing proceeds to step 106, where motion estimation of the two low resolution images is performed, and multi frame super resolution processing is performed on the candidate region searched in the candidate region search processing to create a super resolution image of the candidate region. The motion estimation of the two low resolution images may use, for example, a normalized correlation, a phase-limited correlation, or the like, or may use the servo movement quantity of head moving device 25 for moving mark imaging camera 36 as is. When there are multiple candidate regions searched in the candidate region search processing, as shown in FIG. 5, a super resolution image is created for each candidate region.

Then, proceeding to step 107, the shape, dimensions, brightness value, and the like of the portion that has a possibility of being a reference mark appearing in the super resolution image of each candidate region are recognized, and whether the portion is a reference mark is determined based on the recognition result based on the shape, dimension, brightness value, and the like, so as to identify the candidate region actually containing the reference mark. When there is only one candidate region searched in the candidate region search processing, it is confirmed that the reference mark exists in the super resolution image of the candidate region.

Then, proceeding to step 108, the position of the reference mark in the super resolution image of the candidate region specified in step 107 is recognized, and the program ends.

According to an embodiment described above, since candidate region search processing of processing a low resolution image captured initially (first) to search for at least one region within the image including a portion that has a possibility of being a reference mark as a candidate region is performed, even if the position of the reference mark in the low resolution image captured by mark imaging camera 36 is shifted greatly due to poor conveyance accuracy of conveyor 13, the region including a portion in the image that has a possibility of being a reference mark can be limited as a candidate region by the candidate region search processing. Further, when a pattern or the like having a shape similar to the reference mark is captured in the low resolution image captured by mark imaging camera 36, and it is difficult to distinguish and recognize the pattern or the like having a shape similar to the reference mark from the reference mark, multiple regions in the image including a portion that has a possibility of being the reference mark can be limited as multiple candidate regions by the candidate region search processing, and the reference mark can be included in one of the multiple candidate regions.

Moreover, since the candidate region searching processing is performed in parallel with the operation of moving mark imaging camera 36 to the next imaging position after the initial (first) imaging is completed, unlike when the candidate region searching processing is performed after the final (second) imaging is completed, it is possible to avoid delaying the starting of the multi frame super resolution processing by the candidate region searching processing after the final imaging is completed.

Further, since the multi frame super resolution processing is performed only in the candidate region searched by the candidate region search processing using multiple low resolution images after the final imaging is completed, the multi frame super resolution processing can be shortened as compared with a case where the multi frame super resolution processing is performed on all the regions of the low resolution image. Moreover, since the super resolution image of the candidate region searched in the candidate region search processing is created to recognize the reference mark, the reference mark can be recognized with high accuracy using the super resolution image of the candidate region, and when the region including the pattern or the like of a shape similar to the reference mark is searched as the candidate region, the pattern or the like of the shape similar to the reference mark can be recognized by distinguishing the reference mark from the pattern or the like using the super resolution image of the candidate region, making it possible to prevent the pattern or the like of the shape similar to the reference mark from being erroneously recognized as the reference mark.

Note that, in an embodiment above, only one reference mark is within the field of view of mark imaging camera 36, but multiple reference marks may be within the field of view of mark imaging camera 36. In this case, candidate region search processing may be performed for each reference mark to search for at least one region including a portion that has a possibility of being a reference mark as a candidate region of the reference mark.

Further, in an embodiment above, the recognition target of circuit board 12 has been described as a reference mark, but in systems for performing image recognition of any of codes, characters, symbols, or marks, such as barcodes or two-dimensional codes indicating board information of circuit board 12, the present disclosure may be implemented using any of codes, characters, symbols, or marks indicating board information as the recognition target. This is because codes, characters, symbols, and marks indicating board information of circuit board 12 tend to be miniaturized in the same manner as reference marks.

Further, the present disclosure is not limited to a component mounter, and naturally may be implemented within various modifications within a range that does not deviate from the gist of the disclosure, for example, by being applied to a component insertion machine, a screen printer, a visual inspection machine, or the like, that is an apparatus for performing image recognition of a recognition target such as a reference mark of a circuit board loaded by a conveyor.

REFERENCE SIGNS LIST

12: circuit board;
13: conveyor;
24: mounting head;
25: head moving device (moving device);
31: control device (image processing device);
36: mark imaging camera (camera)

The invention claimed is:

1. An apparatus for performing work on a substrate comprising:
   a conveyor configured to load a circuit board to a work position;
   a camera configured to image a region including a recognition target of the circuit board loaded to the work position, the camera being movable relatively to the circuit board loaded to the work position; and
   a control device including circuitry configured to move the camera to a first imaging location in which the camera is located above the recognition target, perform a first imaging with the camera at the first imaging location in which a first image is obtained, the first image including the recognition target and a surrounding area of the recognition target, move the camera to a second imaging location in which the recognition target of the circuit board is within a range inside a field of view of the camera, perform a second imaging with the camera at the second imaging location in which a second image is obtained, perform candidate region search processing of processing the first image to search within the first image for at least one region including a portion that might be the recognition target as a candidate region, the candidate region search processing being performed immediately after the first image is obtained and in parallel with moving the camera to the second imaging location and performing the second imaging, perform super resolution processing on the candidate region searched in the candidate region search processing, and create a super resolution image of the candidate region using the first image and the second image, and recognize the recognition target in the super resolution image of the candidate region.

2. The apparatus for performing work on a substrate according to claim 1, wherein
the circuitry is configured to, when multiple candidate regions exist, create a super resolution image for each of the candidate regions, and identify whether a portion of the super resolution image has a possibility of being the recognition target is the recognition target based on a recognition result of the super resolution image.

3. The apparatus for performing work on a substrate according to claim 1, wherein
the circuitry is configured to be able to change a criterion for determining whether the candidate region is set in the candidate region search processing based on at least one of a design around the recognition target of the circuit board, or a size, shape, material, or brightness values of the recognition target.

4. The apparatus for performing work on a substrate according to claim 1, wherein
the recognition target is any one of a reference mark that is a reference position of the circuit board or a code, a character, a symbol, or a mark representing board information.

5. The apparatus for performing work on a substrate according to claim 1, wherein
the circuitry is configured to, in a case in which the candidate region search processing has not completed at the point at which the second imaging has been completed, complete the candidate region search processing and then perform the super resolution processing on the candidate region.

6. The apparatus for performing work on a substrate according to claim 1, wherein
the circuitry is configured to, in a case in which the candidate region search processing has not completed at the point at which the second imaging has been completed, at a point at which a specified quantity of candidate regions have been searched or after a specified time has elapsed, complete the candidate region search processing and then perform the super resolution processing on the candidate region.

7. The apparatus for performing work on a substrate according to claim 1, further comprising:
a display device configured to display an image processed by the control device, wherein
the circuitry is configured to, among the image displayed on the display device, display the super resolution image of the candidate region, and display in other regions a low resolution image magnified at a same magnification as the super resolution image or a background of a specified brightness level.

8. The apparatus for performing work on a substrate according to claim 1, wherein
the camera is moved by a head moving device configured to move a mounting head for mounting components on the circuit board, and the camera is provided to be moved by the head moving device together with the mounting head.

* * * * *